United States Patent
Kong et al.

(10) Patent No.: US 12,301,187 B2
(45) Date of Patent: May 13, 2025

(54) SIGNAL INPUT/OUTPUT CIRCUIT AND METHOD OF OPERATING THE SIGNAL INPUT/OUTPUT CIRCUIT

(71) Applicant: SK hynix Inc., Icheon-si (KR)

(72) Inventors: In Seok Kong, Icheon-si (KR); Min Su Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 162 days.

(21) Appl. No.: 18/111,437

(22) Filed: Feb. 17, 2023

(65) Prior Publication Data

US 2024/0007067 A1    Jan. 4, 2024

(30) Foreign Application Priority Data

Jun. 29, 2022    (KR) .................. 10-2022-0079722

(51) Int. Cl.
   *H03F 1/26*    (2006.01)
   *H03F 3/45*    (2006.01)

(52) U.S. Cl.
   CPC .......... *H03F 3/45475* (2013.01); *H03F 1/26* (2013.01)

(58) Field of Classification Search
   CPC .... H03F 3/45475; H03F 3/45183; H03F 3/62; H03F 3/72; H03F 3/211; H03F 1/26; H03F 2200/405; G11C 7/1048; G11C 7/08; G11C 7/1063; G11C 7/109; G11C 7/1006; G11C 7/1051; G11C 7/1078
   See application file for complete search history.

(56) References Cited

U.S. PATENT DOCUMENTS

| | | | | |
|---|---|---|---|---|
| 9,160,324 | B2* | 10/2015 | Hwang | H03K 6/04 |
| 11,487,312 | B2* | 11/2022 | Migliavacca | G05F 1/575 |
| 2009/0146697 | A1* | 6/2009 | Lee | H03K 19/01721 |
| | | | | 327/108 |
| 2009/0154255 | A1* | 6/2009 | Amirabadi | G11C 7/1078 |
| | | | | 330/253 |
| 2013/0162353 | A1* | 6/2013 | Hwang | H03F 3/45076 |
| | | | | 330/260 |
| 2014/0177696 | A1* | 6/2014 | Hwang | H04L 25/0272 |
| | | | | 375/232 |
| 2015/0042394 | A1* | 2/2015 | Hwang | H03K 6/02 |
| | | | | 327/306 |
| 2015/0187423 | A1* | 7/2015 | Kang | G11C 7/22 |
| | | | | 327/306 |
| 2016/0079926 | A1* | 3/2016 | Ichikura | G09G 3/36 |
| | | | | 330/251 |
| 2022/0200544 | A1* | 6/2022 | Xu | H03F 3/45475 |

(Continued)

FOREIGN PATENT DOCUMENTS

| | | |
|---|---|---|
| KR | 100510548 B1 | 8/2005 |
| KR | 101798992 B1 | 12/2017 |
| KR | 1020200115805 A | 10/2020 |

*Primary Examiner* — Seokjin Kim
(74) *Attorney, Agent, or Firm* — WILLIAM PARK & ASSOCIATES LTD.

(57) ABSTRACT

A signal input/output circuit includes a signal amplification circuit and a current control circuit. The signal amplification circuit configured to amplify and output an input signal transmitted through an input/output line. The current control circuit configured to induce a reverse virtual current corresponding to an output signal of the signal amplification circuit. The current control unit configured to reflect the reverse virtual current on the input/output line.

8 Claims, 4 Drawing Sheets

(56) References Cited

U.S. PATENT DOCUMENTS

2022/0368321 A1* 11/2022 Wu .......................... H03F 3/005
2022/0416781 A1* 12/2022 Bonache Martinez ......................
                                                    H03K 17/687

* cited by examiner

SIGNAL INPUT/OUTPUT CIRCUIT AND METHOD OF OPERATING THE SIGNAL INPUT/OUTPUT CIRCUIT

CROSS-REFERENCES TO RELATED APPLICATION

The present application claims priority under 35 U.S.C. § 119(a) to Korean application number 10-2022-0079722, filed on Jun. 29, 2022, in the Korean Intellectual Property Office, which is incorporated herein by reference in its entirety.

BACKGROUND

1. Technical Field

Various embodiments generally relate to a signal input/output circuit and a method of operating the signal input/output circuit, more particularly, to a signal input/output circuit configured to buffer and output an input signal and a method of operating the signal input/output circuit.

2. Related Art

Generally, a semiconductor device may receive at least one input signal to perform a specific operation, thereby generating at least one output signal based on the specific operation. The semiconductor device may include a signal input/output circuit configured to receive the input signal and to generate the output the signal. The signal input/output circuit may include a buffer circuit to process an external signal or an internal signal.

Recently, the semiconductor device may have been developed to have a rapid speed, a small size, low power consumption, a massive capacity, etc. Thus, transmission speeds and transmission bandwidths of the input signal and the output signal may be greatly increased.

Currently, the input signal and the output signal of the semiconductor device may be required to have a high signal quality acceptable to satisfy the increased transmission speeds and the increased transmission bandwidths. For example, one of the ways to improve the signal quality is to reduce a capacitance of an input/output line through which the input signal and the output signal may be transmitted.

However, to reduce the capacitance of the input/output line, a specific circuit configured to reduce the capacitance of the input/output line have to be added to the signal input/output circuit. Moreover, the specific circuit may affect operations of other circuits of the semiconductor device.

SUMMARY

According to various embodiments, there may be provided a signal input/output circuit. The signal input/output circuit may include a signal amplification circuit and a current control circuit. The signal amplification circuit may be configured to amplify an input signal and output the amplified input signal, as an output signal. The signal amplification circuit may include at least one input/output line for transmitting the input signal and the output signal. The current control circuit may be configured to generate a reverse virtual current for offsetting parasitic currents of the input/output line, based on the output signal of the signal amplification circuit.

According to various embodiments, there may be provided a signal input/output circuit. The signal input/output circuit may include an input/output receiving circuit, an input/output transmission circuit and an activation control circuit. The input/output receiving circuit may amplify a receiving signal input through a first input/output line. The input/output receiving circuit may output an amplified receiving signal to a second input/output line. The input/output receiving circuit may induce a reverse virtual current corresponding to an output signal through the second input/output line. The input/output receiving circuit may reflect the reverse virtual current on the first input/output line. The input/output transmission circuit may amplify a transmission signal input through the second input/output line. The input/output transmission circuit may output an amplified transmission signal to the first input/output line. The activation control circuit may control activation operations of the input/output receiving and transmission circuits based on a receiving operation mode and a transmission operation mode.

According to various embodiments, there may be provided a method of operating a signal input/output circuit. In the method of operating the signal input/output circuit, an input/output receiving circuit may be activated in a receiving operation mode to receive a receiving signal through an input/output line. A reverse virtual current corresponding to an output signal from the input/output receiving circuit may be induced to control a capacitance of the input/output line. An input/output transmission circuit may be activated in a transmission operation mode to output a transmission signal through the input/output line. The input/output receiving circuit may be activated in the transmission operation mode to induce a reverse virtual current to the input/output line.

BRIEF DESCRIPTION OF THE DRAWINGS

The above and another aspects, features and advantages of the subject matter of the present disclosure will be more clearly understood from the following detailed description taken in conjunction with the accompanying drawings, in which.

DETAILED DESCRIPTION

Various embodiments of the present disclosure will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present disclosure as defined in the appended claims.

The present disclosure is described herein with reference to cross-section and/or plan illustrations of idealized embodiments of the present disclosure. However, embodiments of the present disclosure should not be construed as limiting the concepts. Although a few embodiments of the present disclosure will be shown and described, it will be appreciated by those of ordinary skill in the art that changes may be made in these embodiments without departing from the principles and spirit of the present disclosure. It will be understood that although the terms "first," "second," "third," etc. are used herein to describe various elements, these elements should not be limited by these terms. These terms are only used to distinguish one element from another element and are not intended to imply an order or number of elements. Thus, a first element in some embodiments could be termed a second element in other embodiments without departing from the teachings of the present disclosure.

According to various embodiments, the reverse virtual current with respect to the input/output line through which the input signal and the output signal may be transmitted may be induced to reduce the capacitance reflected on the input/output line to improve signal qualities of the input signal and the output signal.

Figure 1:
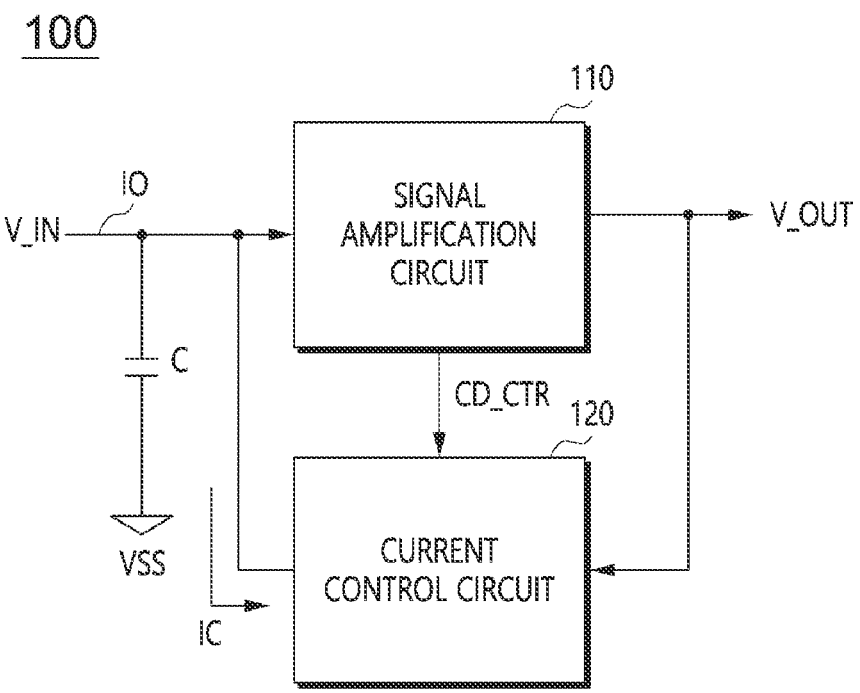
FIG. 1 is a block diagram illustrating a signal input/output circuit in accordance with various embodiments.

FIG. 1 is a block diagram illustrating a signal input/output circuit in accordance with various embodiments.

Referring to FIG. 1, a signal input/output circuit 100 may be configured to buffer an input signal V_IN and to output an output signal V_OUT. The signal input/output circuit 100 may include a signal amplification circuit 110 and a current control circuit 120.

The signal amplification circuit 110 may amplify the input signal V_IN transmitted through an input/output line IO. The signal amplification circuit 110 may amplify the input signal VIN to generate the output signal V_OUT. The output signal V_OUT amplified by the signal amplification circuit 100 may be provided to an internal circuit electrically connected to the signal input/output circuit 100.

The current control circuit 120 may induce a reverse virtual current IC corresponding to the output signal V_OUT of the signal amplification circuit 110. The current control circuit 120 may generate the reverse virtual current IC based on the output signal V_OUT. The current control circuit 120 may then reflect the reverse virtual current IC on the input/output lines IO.

The signal input/output circuit 100 may further include a capacitor C connected to the input/output line IO. For example, the capacitor C may include a parasitic capacitor generated in a buffer (not shown) or a pad (not shown) that are connected to the input/output line IO.

In various embodiments, the signal input/output circuit 100 may reflect the reverse virtual current IC corresponding to the output signal V_OUT on the input/output line IO. Thus, the capacitance of the capacitor C in the input/output line IO may be decreased by the reverse virtual current IC. As a result, in an embodiment, the capacitance of the input/output line IO may also be reduced to improve signal quality of the input signal V_IN input into the signal input/output circuit 100 through the input/output line IO.

Figure 2:
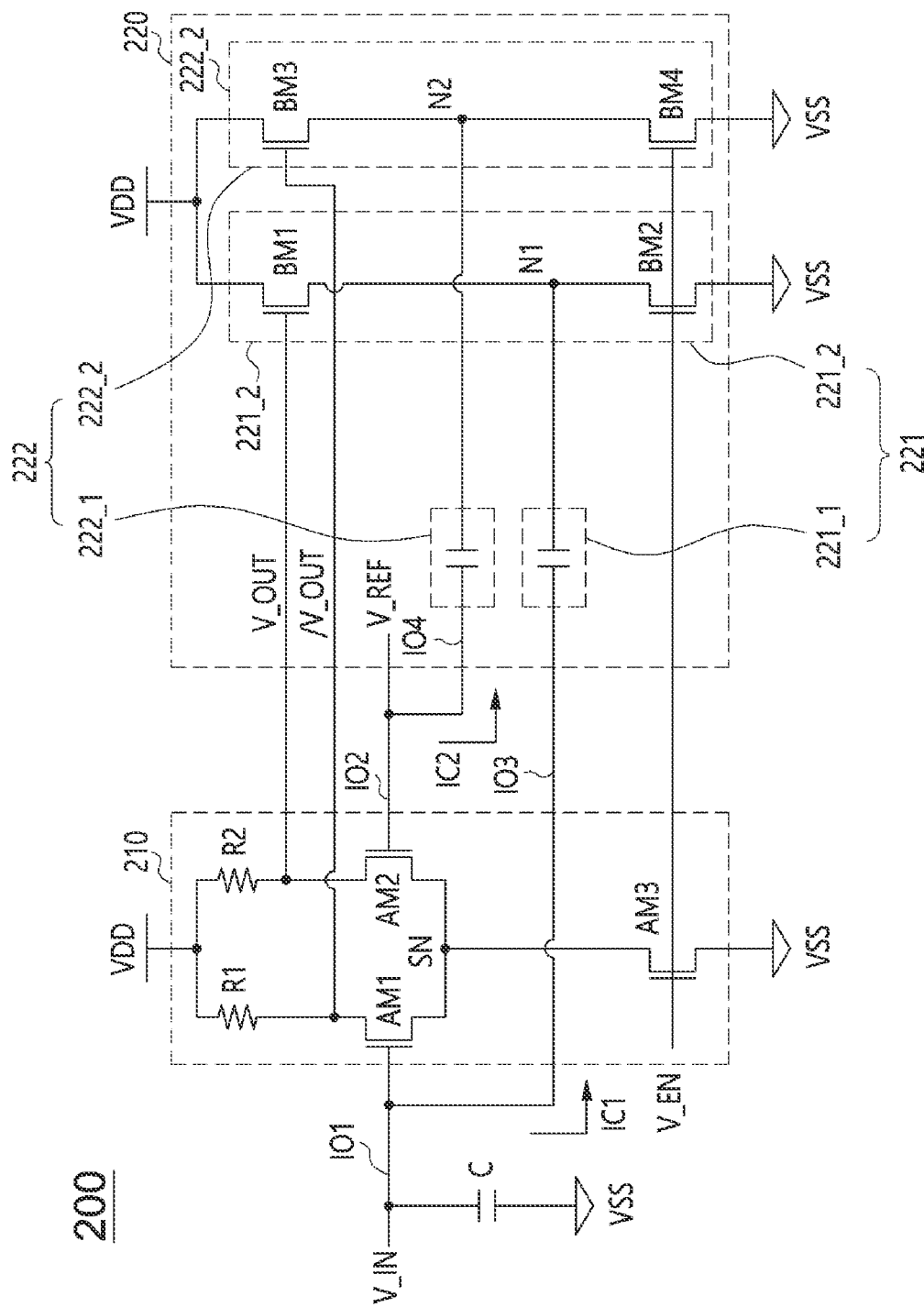
FIG. 2 is a circuit diagram illustrating a signal input/output circuit in accordance with various embodiments.

FIG. 2 is a circuit diagram illustrating a signal input/output circuit in accordance with various embodiments.

Referring to FIG. 2, a signal input/output circuit 200 may include a signal amplification circuit 210 and a current control circuit 220. In various embodiment, the signal amplification circuit 210 and the current control circuit 220 may correspond to the signal amplification circuit 110 and the current control circuit 120 in FIG. 1, respectively. For conveniences of explanations, in FIG. 2, the output signal V_OUT in FIG. 1 may include a positive output signal V_OUT and a negative output signal/V_OUT. The positive output signal V_OUT may correspond to the input signal V_IN. The positive output signal V_OUT may have phase opposite to phase of the negative output signal/VOUT.

The signal amplification circuit 210 may amplify the input signal V_IN. For example, the signal amplification circuit 210 may include a differential amplification circuit. The signal amplification circuit 210 may receive the input signal V_IN and a reference voltage signal V_REF. The input signal V_IN may be input to the signal amplification circuit 210 by a first input/output line IO1. The reference voltage signal V_REF may be input to the signal amplification circuit 210 by a second input/output line IO2.

The signal amplification circuit 210 may amplify the input signal VIN based on a reference voltage signal V_REF to generate the positive output signal V_OUT and the negative output signal/V_OUT. The signal amplification circuit 210 may include first and second resistors R1 and R2 and first to third MOS transistors AM1, AM2 and AM3.

The first resistor R1 and the first MOS transistor AM1 may be connected between a supply power voltage terminal VDD and a sourcing node SN, in series. A gate of the first MOS transistor AM1 may receive the input signal V_IN. The negative output signal/V_OUT may be output through a first connecting node between the first resistor R1 and the first MOS transistor AM1. The second resistor R2 and the second MOS transistor AM2 may be connected between the supply power voltage terminal VDD and the sourcing node SN, in series. A gate of the second MOS transistor AM2 may receive the reference voltage signal V_REF. The positive output signal V_OUT may be output through a second connecting node between the second resistor R2 and the second MOS transistor AM2. The third MOS transistor AM3 may be connected between a ground power voltage terminal VSS and the sourcing node SN. A gate of the third MOS transistor AM3 may receive an enable signal V_EN. The enable signal V_EN may have a bias voltage level during an enable section for activating the signal amplification circuit 210.

In an embodiment, the current control circuit 220 may induce a first reverse virtual current IC1 corresponding to the positive output signal V_OUT and a second reverse virtual current IC2 corresponding to the negative output signal/V_OUT. The current control circuit 220 may include a first current control unit 221 and a second current control unit 222.

As above, the first current control unit 221 may induce the first reverse virtual current IC1 corresponding to the positive output signal V_OUT. The first current control unit 221 may reflect the first reverse virtual current IC1 on the input/output lines IO, for example, the first input/output line IO1. The first current control unit 221 may include a first capacitor 221_1 and a first voltage buffer 221_2.

The first capacitor 221_1 may be configured to generate the first reverse virtual current IC1. The first capacitor 221_1 may be connected between the first input/output line IO1 and the first voltage buffer 221_2. The first voltage buffer 221_2 may be configured to apply a voltage corresponding to the positive output signal V_OUT of the signal amplification circuit 210 to the first capacitor 221_1. The first voltage buffer 221_2 may include a first MOS transistor BM1 and a second MOS transistor BM2 which are connected between the supply power voltage terminal VDD and the ground power voltage terminal VSS, in series. Here, a first node N1 may be a connecting node between the first MOS transistor BM1 and the second MOS transistor BM2.

A gate of the first MOS transistor BM1 may receive the positive output signal V_OUT. A gate of the second MOS transistor BM2 may receive the enable signal V_EN. In an embodiment, the first capacitor 221_1 may be generated in a third input/output line IO3 between the first input/output line IO1 and the first node N1 of the first voltage buffer 221_2. For example, a capacitance of the first capacitor 221_1 and a characteristic of the first voltage buffer 221_2 may be set in consideration of the positive output signal V_OUT. In other words, characteristics of the first capacitor 221_1, the first and second MOS transistors BM1 and BM2 of the first current control unit 221 may be set such that the first reverse virtual current IC1 can be generated to offset degradation of the signal quality due to the capacitance of the capacitor C of the first input/output line IO1.

The second current control unit 222 may induce the second reverse virtual current IC2 corresponding to the negative output signal/V_OUT. The second current control unit 222 may reflect the second reverse virtual current IC2 on the input/output lines IO, for example, the second input/output line IO2. The second current control unit 222 may include a second capacitor 222_1 and a second voltage buffer 222_2.

The second capacitor 222_1 may be configured to generate the second reverse virtual current IC2. The second capacitor 222_1 may be connected between the second input/output line I02 and the second voltage buffer 222_2. The second voltage buffer 222_2 may be configured to apply a voltage corresponding to the negative output signal/V_OUT of the signal amplification circuit 210 to the second capacitor 222-1. The second voltage buffer 222_2 may include a third MOS transistor BM3 and a fourth MOS transistor BM4 connected between the supply power voltage terminal VDD and the ground power voltage terminal VSS, in series. Here, a second node N2 may be a connection node between the third MOS transistor BM3 and the fourth MOS transistor BM4. A gate of the third MOS transistor BM3 may receive the negative output signal /V_OUT. A gate of the fourth MOS transistor BM4 may receive the enable signal V_EN. In an embodiment, the second capacitor 222_1 may be generated in a fourth input/output line 104 between the second input/output line 102 and the second node N2 of the second voltage buffer 222_2. In an embodiment, the second capacitor 222_1 may be generated in a fourth input/output line 104 between the second first input/output line IO1 and the first node N1 of the first voltage buffer 221_2. For example, a capacitance of the second capacitor 222_1 and a characteristic of the second voltage buffer 222_2 may be set in consideration of the negative output signal/V_OUT of the signal amplification circuit 210. For example, characteristics of the second capacitor 222_1, the third and fourth MOS transistors BM3 and BM4 of the second current control unit 222 may be set such that the second reverse virtual current IC2 can be generated to offset degradation of the signal quality due to the parasitic capacitance of the second input/output line IO2.

Hereinafter, an operation of the signal input/output circuit 200 may be illustrated.

When the enable signal V_EN is activated, the signal amplification circuit 210 and the current control unit 220 may be activated. The signal amplification circuit 210 may compare the input signal V_IN with the reference voltage signal V_REF. The signal amplification circuit 210 may then amplify the input signal V_IN to generate the positive output signal V_OUT and the negative output signal/V_OUT.

The first voltage buffer 221_2 may apply the voltage corresponding to the positive output signal V_OUT to the first capacitor 221_1. The first reverse virtual current IC1 may be induced to the first capacitor 221_1. The first reverse virtual current IC1 may be reflected on the input/output line IO. The first reverse virtual current IC1 may have a direction opposite to a direction of the current in the capacitor C based on the input signal V_IN. The first reverse virtual current IC1 may have a phase difference with respect to the current in the capacitor C the input signal V_IN by about 90°. Thus, the capacitance of the capacitor C may be actually decreased by the first reverse virtual current IC1. As a result, in an embodiment, the capacitance of the input/output line IO connected to the capacitor C may also be reduced to improve the signal quality of the input signal V_IN.

In an embodiment, since the current of the capacitor C may be canceled by the first reverse virtual current IC1 generated by the first current control unit 221, the signal quality of the input/output line IO, especially, the first input/output line IO1 may be improved.

Meanwhile, the first reverse virtual current IC1 may act as a noise component from the point of view of the reference voltage signal V_REF, which is the other input terminal of the signal amplification circuit 210. Thus, the second capacitor 222_1 and the second voltage buffer 222_2 may be configured to generate the second reverse virtual current IC2 capable of offsetting the noise component due to the first reverse virtual current IC1. As a result, the second reverse virtual current IC2 may correspond to the negative output signal/V_OUT and the first reverse virtual current IC1.

Since the first reverse virtual current IC1 may be provided to the first input/output line IO1 and the second reverse virtual current IC2 may be provided to the second input/output line IO2, in an embodiment, the signal qualities of the input signal V_IN and the reference voltage signal V_REF may be improved.

For example, when each of transconductances the first and second transistors AM1 and AM2 of the signal amplification circuit 210 is "Gm" and each of resistances of the first and second resistors R1 and R2 is "Rd", a voltage level of the positive output signal V_OUT is "0.5*(Gm*Rd)*V_IN" and a voltage level of the negative output signal/V_OUT is "−{0.5*(Gm*Rd)−1}*V_IN". When the capacitance of the capacitor C is "Cp", a parasitic current of the first input/output line IO1 is "−0.5*(Gm*Rd)*V_IN*jwCp" and the first current control unit 221 is configured to generate as much current as "−{0.5*(Gm*Rd)−1}*V_IN*jwCp". In an embodiment, the current control circuit 120 may be configured to generate a reverse virtual current IC for offsetting parasitic currents of the input/output line IO, based on the output signal V_OUT of the signal amplification circuit 110.

Figure 3:
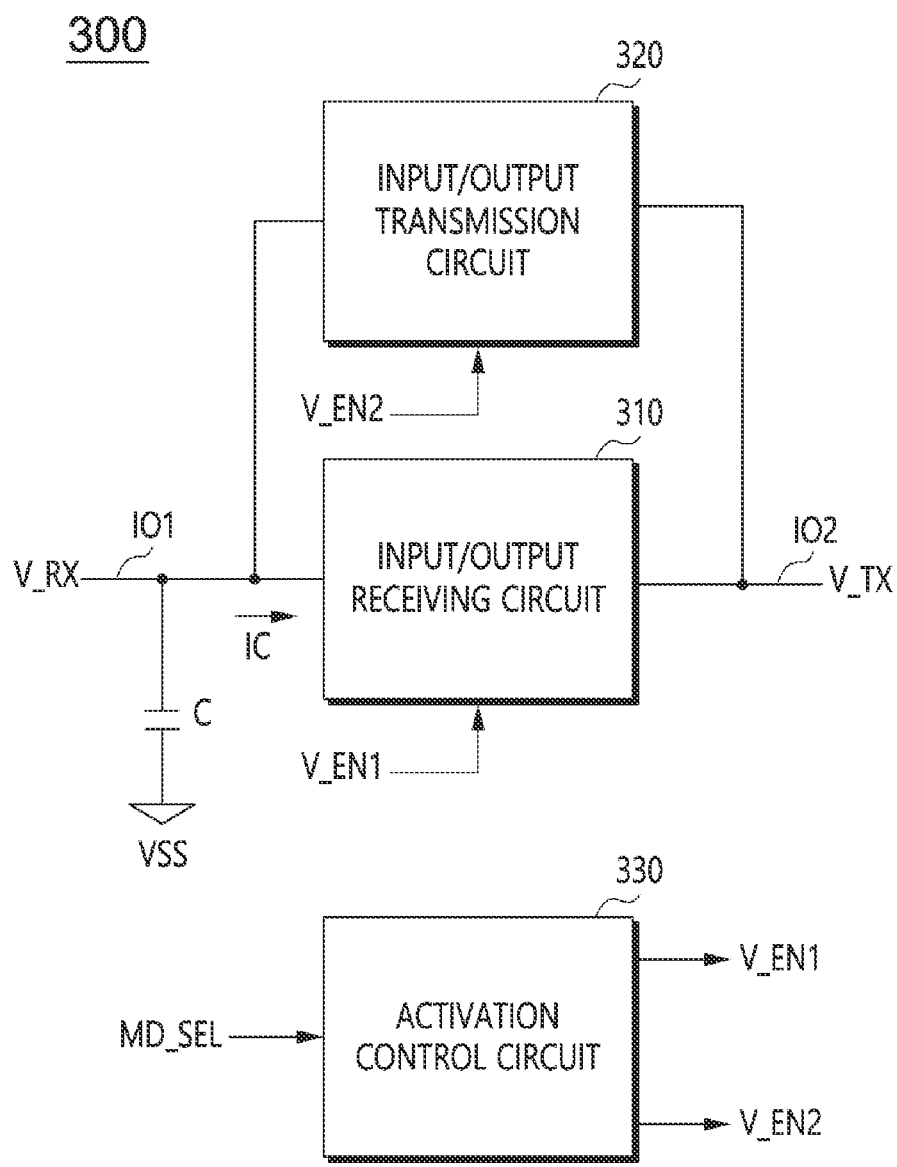
FIG. 3 is a block diagram illustrating a signal input/output circuit in accordance with various embodiments.

FIG. 3 is a block diagram illustrating a signal input/output circuit in accordance with various embodiments.

Referring to FIG. 3, a signal input/output circuit 300 may amplify and output a receiving signal V_RX. The signal input/output circuit 300 may receive and amplify a transmission signal V_TX. For conveniences of explanations, the signal input/output circuit 300 may be included in a semiconductor device. For example, the receiving signal V_RX may be a signal input into the semiconductor device from a controller. For example, the transmission signal V_TX may be a signal output from the semiconductor device to the controller. That is, the semiconductor device may receive the receiving signal V_RX input from the controller through the signal input/output circuit 300. The semiconductor device may then amplify the receiving signal V_RX. The semiconductor device may transmit the amplified receiving signal into the semiconductor device. The semiconductor device may receive and amplify the transmission signal V_TX generated in the semiconductor device through the signal input/output circuit 300. The semiconductor device may then transmit the amplified transmission signal V_TX to the controller.

The signal input/output circuit 300 may include an input/output receiving circuit 310, an input/output transmission circuit 320 and an activation control circuit 330.

The input/output receiving circuit 310 may amplify the receiving signal V_RX input through a first input/output line IO1. The input/output receiving circuit 310 may then output the amplified receiving signal to a second input/output line IO2. The input/output transmission circuit 320 may induce a reverse virtual current corresponding to the output signal through the second input/output line IO2. The input/output transmission circuit 320 may then reflect the reverse virtual current on the first input/output line IO1. The input/output receiving circuit 310 may be activated based on a first enable signal V_EN1 activated in a receiving operation mode and a transmission operation mode. The input/output transmission circuit 320 may amplify the receiving signal V_RX in the receiving operation mode. The input/output transmission circuit 320 may then output the amplified receiving signal to the second input/output line IO2. The input/output receiving circuit 310 may be activated in the transmission operation mode to induce the reverse virtual current to the first input/output line IO1, thereby reflecting the reverse virtual current on the first input/output line IO1.

The input/output receiving circuit 310 may correspond to the signal input/output circuit 200 in FIG. 2. That is, the first input/output line IO1 in FIG. 3 may correspond to the first input/output line IO1 in FIG. 2. The second input/output line IO2 in FIG. 3 may correspond to the second input/output line IO2 in FIG. 2. The first enable signal V_EN1 in FIG. 3 may correspond to the enable signal V_EN in FIG. 2. The reverse virtual current IC in FIG. 3 may correspond to the first reverse virtual current IC1 in FIG. 2. Because configurations and operations of the input/output receiving circuit 310 may be illustrated with reference to FIG. 2, in an embodiment, the input/output receiving circuit 310 may induce the reverse virtual current IC corresponding to the output signal output through the second input/output line IO2 to reduce the capacitance of the first input/output line IO1.

The input/output transmission circuit 320 may amplify the transmission signal V_TX input through the second input/output line IO2 to output the amplified transmission signal to the first input/output line IO1. The input/output transmission circuit 320 may include a differential amplification circuit similarly to the signal amplification circuit 210 in FIG. 2. The input/output transmission circuit 320 may be activated based on a second enable signal V_EN2 activated in the transmission operation mode. Thus, the input/output transmission circuit 320 may amplify the transmission signal V_TX in the transmission operation mode to output the amplified transmission signal through the first input/output line IO1.

The activation control circuit 330 may control the activation operations of the input/output receiving and transmission circuits 310 and 320 based on the receiving operation mode and the transmission operation mode. The activation control circuit 330 may activate the first and second enable signals V_EN1 and V_EN2 based on a mode selection signal MD_SEL corresponding to the receiving operation mode and the transmission operation mode. The activation control circuit 330 may activate the input/output receiving circuit 310 in the receiving operation mode. The activation control circuit 330 may activate the input/output receiving and transmission circuits 310 and 320 in the transmission operation mode.

The input/output transmission circuit 320 may amplify the transmission signal V_TX in the transmission operation mode to output the amplified transmission signal through the first input/output line IO1. The output signal transmitted through the first input/output line IO1 may have bad signal quality due to the capacitance of the first input/output line IO1. Here, the bad signal quality may mean that a signal value(level) is variable or inaccurate due to noise components or the like. However, according to various embodiments, the signal input/output circuit 300 may activate the input/output receiving circuit 310 in the transmission operation mode. When the input/output receiving circuit 310 is activated, the output signal output through the first input/output line IO1 may be input into the input/output receiving circuit 310. Thus, the input/output receiving circuit 310 may induce the reverse virtual current IC. The input/output receiving circuit 310 may then reflect the reverse virtual current IC on the first input/output line IO1. As a result, in an embodiment, the reverse virtual current IC may be induced to the first input/output line IO1 by the input/output receiving circuit 310 in the transmission operation mode to reduce the capacitance. Further, in an embodiment, the input/output transmission circuit 320 may transmit the transmission signal V_TX having the improved signal quality due to the first input/output line IO1 having the low capacitance to the controller.

According to various embodiments, the signal input/output circuit 300 may activate the input/output receiving circuit 310, which may be activated in the receiving operation mode, in the transmission operation mode to reduce the capacitance of the first input/output line IO1.

Figure 4:
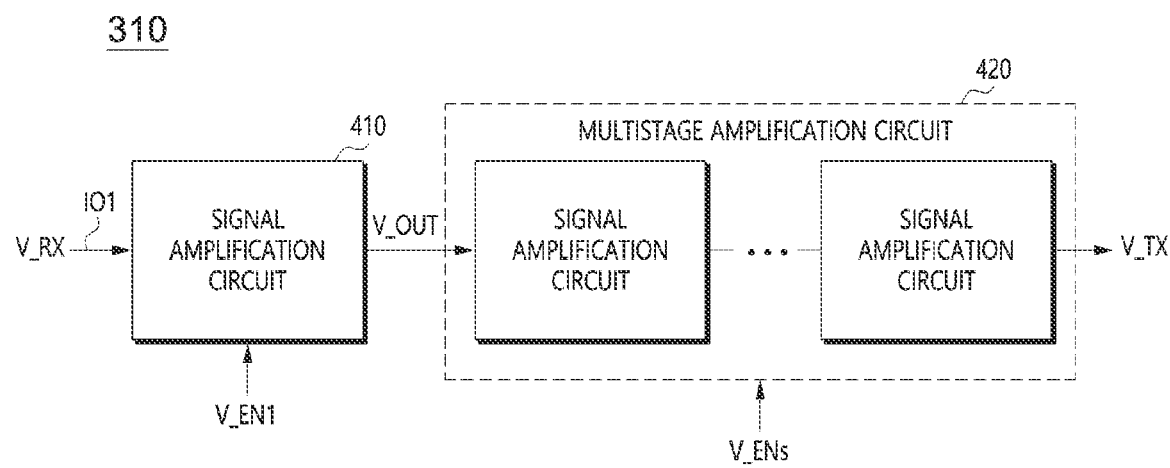
FIG. 4 is a view illustrating an input/output receiving circuit in FIG. 3.

FIG. 4 is a view illustrating an input/output receiving circuit in FIG. 3.

Referring to FIG. 4, the input/output receiving circuit 310 may include a signal amplification circuit 410. The signal amplification circuit 410 may correspond to the signal amplification circuit 210 in FIG. 2. For conveniences of explanations, elements corresponding to the current control unit 220 in FIG. 2 may be omitted in FIG. 4.

The input/output receiving circuit 310 may include a multistage amplification circuit 420. The multistage amplification circuit 420 may receive an output signal V_OUT from the signal amplification circuit 410 to continuously amplify the output signal V_OUT. The multistage amplification circuit 420 may be connected to a plurality of signal amplification circuits, in series. The multistage amplification circuit 420 may receive an output signal from a front signal amplification circuit to provide a rear signal amplification circuit with the output signal.

The multistage amplification circuit 420 may be activated and inactivated based on a plurality of enable signals V_ENs. The multistage amplification circuit 420 may be activated in the receiving operation mode based on the enable signals V_ENs. The multistage amplification circuit 420 may be inactivated in the transmission operation mode based on the enable signals V_ENs. Although not depicted in drawings, the activation control circuit 330 in FIG. 3 may generate the enable signals V_ENs based on the mode selection signal MD_SEL.

Referring to FIGS. 3 and 4, the signal amplification circuit 410 and the multistage amplification circuit 420 in the input/output receiving circuit 310 may be activated in the receiving operation mode. The input/output transmission circuit 320 and the signal amplification circuit 410 in the input/output receiving circuit 310 may be activated and the multistage amplification circuit 420 may be inactivated in the transmission operation mode. In an embodiment, when the multistage amplification circuit 420 is inactivated in the transmission operation mode, the signal input/output circuit 300 may decrease power consumed in the transmission operation mode.

According to various embodiments, the signal input/output circuit 300 may selectively activate and the inactivate the signal amplification circuit 410 and the multistage amplification circuit 420 in the transmission operation mode and the receiving operation mode to reduce the capacitance of the first input/output line IO1 and to minimize the power consumption in the transmission and receiving modes.

Figure 5:
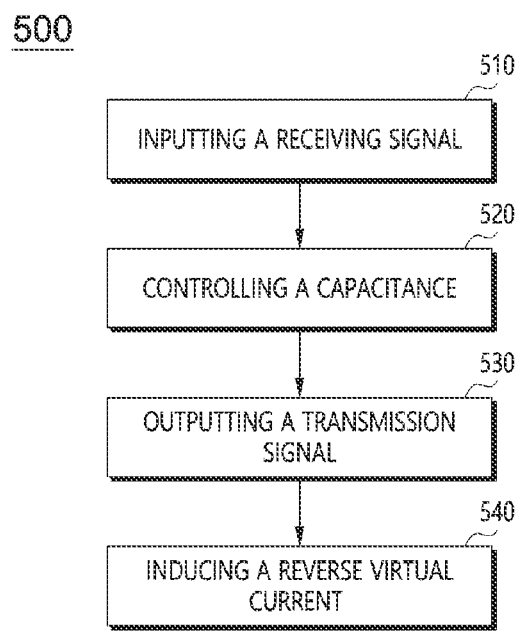
FIG. 5 is a view illustrating a method of operating a signal input/output circuit in accordance with various embodiments.

FIG. 5 is a view illustrating a method of operating a signal input/output circuit in accordance with various embodiments.

Referring to FIGS. 3 and 5, a method 500 for operating the signal input/output circuit may include an operation 510 for inputting a receiving signal, an operation 520 for controlling a capacitance, an operation 530 for outputting a transmission signal and an operation 540 for inducing a reverse virtual current.

The operation 510 for inputting the receiving signal may include activating an input/output receiving circuit in a receiving operation mode and receiving the receiving signal through an input/output line. The operation 510 for inputting the receiving signal may be performed by the input/output receiving circuit 310 in FIG. 3. As mentioned above, the input/output receiving circuit 310 may be activated in the receiving operation mode. The input/output receiving circuit 310 may receive the receiving signal V_RX through the first input/output line IO1.

The operation 520 for controlling the capacitance may include inducing the reverse virtual current corresponding to the output signal from the input/output receiving circuit to control the capacitance of the input/output line. The operation 520 for controlling the capacitance may be performed by the input/output receiving circuit 310 in FIG. 3. As mentioned above, the input/output receiving circuit 310 may induce the reverse virtual current corresponding to the output signal from the input/output receiving circuit 310 to control the capacitance of the first input/output line IO1.

The operation 530 for outputting the transmission signal may include activating the input/output transmission circuit in the transmission operation mode and outputting the transmission signal through the input/output line. The operation 530 for outputting the transmission signal may be performed by the input/output transmission circuit 320 in FIG. 3. As mentioned above, the input/output transmission circuit 320 may be activated in the transmission operation mode. The input/output transmission circuit 320 may output the transmission signal V_TX through the first input/output line IO1.

The operation 540 for inducing the reverse virtual current may include activating the input/output receiving circuit in the transmission operation mode to induce the reverse virtual current to the input/output line. The operation 540 for inducing the reverse virtual current may be performed by the input/output receiving circuit 310 in FIG. 3. As mentioned above, the input/output receiving circuit 310 may be activated in the transmission operation mode. The input/output receiving circuit 310 may induce the first reverse virtual current IC1 to the first input/output line IO1.

According to various embodiments, the operation method 500 may induce the first reverse virtual current IC1 to the first input/output line IO1 in the receiving operation mode and the transmission operation mode to reduce the capacitance of the first input/output line IO1.

Although not depicted in drawings, the method 500 for operating the signal input/output circuit may include selectively activating and inactivating the input/output receiving circuit 310 and the input/output transmission circuit 320 in accordance with the receiving operation mode and the transmission operation mode. The activating operation and the inactivating operation may be performed by the activation control circuit 330 in FIG. 3. As mentioned above, the activation control circuit 330 may generate the first and second enable signals V_EN1 and V_EN2 for selectively activating and inactivating the input/output receiving circuit 310 and the input/output transmission circuit 320 based on the mode selection signal MD_SEL corresponding to the receiving operation mode and the transmission operation mode.

Further, as mentioned above with reference to FIG. 4, the input/output receiving circuit 310 may include the signal amplification circuits 410 and 420. Thus, the method 500 for operating the signal input/output circuit may include selectively activating and inactivating the signal amplification circuits 410 and 420 in accordance with the receiving operation mode and the transmission operation mode. The activating operation and the inactivating operation may be performed by the activation control circuit 330 in FIG. 3. As mentioned above, the activation control circuit 330 may activate the signal amplification circuit 410 connected to the first input/output line IO1 in the receiving operation mode and the transmission operation mode. The activation control circuit 330 may activate the signal amplification circuit 420 in the receiving operation mode. The activation control circuit 330 may inactivate the signal amplification circuit 420 in the transmission operation mode.

According to various embodiments, the method 500 for operating the signal input/output circuit may induce the reverse virtual current in the receiving operation mode and the transmission operation mode to control the capacitance of the input/output line, thereby improving the signal quality of the receiving signal and the transmission signal transmitted through the input/output line.

The above described embodiments of the present disclosure are intended to illustrate and not to limit the present disclosure. Various alternatives and equivalents are possible. The disclosure is not limited by the embodiments described herein. Nor is the disclosure limited to any specific type of semiconductor device. Other additions, subtractions, or modifications are obvious in view of the present disclosure and are intended to fall within the scope of the appended claims.

What is claimed is:

1. A signal input and output (input/output) circuit comprising:
   an input/output receiving circuit suitable for amplifying a receiving signal input through a first input/output line to output an amplified receiving signal through a second input/output line, generating a reverse virtual current, which corresponds to an output signal through the second input/output line, and providing the reverse virtual current to the first input/output line;
   an input/output transmission circuit suitable for amplifying a transmission signal input through the second input/output line to output an amplified transmission signal through the first input/output line; and
   an activation control circuit suitable for controlling activation operations of the input/output receiving and transmission circuits based on a receiving operation mode and a transmission operation mode.

2. The signal input/output circuit of claim 1,
wherein the activation control circuit activates the input/output receiving circuit in the receiving operation mode and the activation control circuit activates the input/output receiving and transmission circuits in the transmission operation mode.

3. The signal input/output circuit of claim 1,
wherein the input/output receiving circuit includes:
a signal amplification circuit configured to amplify and output the receiving signal transmitted through the first input/output line;
a capacitor connected with the first input/output line to generate the reverse virtual current; and
a voltage buffer configured to apply a voltage, which corresponds to the output signal from the signal amplification circuit, to the capacitor.

4. The signal input/output circuit of claim 3,
wherein the input/output receiving circuit further includes:
a multistage amplification circuit suitable for receiving the output signal of the signal amplification circuit to continuously amplify the output signal,
wherein the multistage amplification circuit is activated in the receiving operation mode and the multistage amplification circuit is inactivated in the transmission operation mode.

5. A method of operating a signal input and output (input/output) circuit, the method comprising:
activating an input/output receiving circuit in a receiving operation mode to receive a receiving signal through an input/output line;
inducing a reverse virtual current, which corresponds to an output signal from the input/output receiving circuit, to control a capacitance of the input/output line;
activating an input/output transmission circuit by a transmission operation mode to output a transmission signal through the input/output line; and
activating the input/output receiving circuit in the transmission operation mode to induce the reverse virtual current to the input/output line.

6. The method of claim 5, further comprising:
selectively activating and inactivating the input/output receiving and transmission circuits based on the receiving operation mode and the transmission operation mode.

7. The method of claim 5,
wherein the input/output receiving circuit includes a plurality of signal amplification circuits continuously connected with each other,
further comprising selectively activating and inactivating the signal amplification circuits in accordance with the receiving operation mode and the transmission operation mode.

8. The method of claim 5,
wherein a selected one of the amplification circuits connected to the input/output line is activated in the receiving operation mode and the transmission operation mode, and other signal amplification circuits are activated in the receiving operation mode and the remaining signal amplification circuits are inactivated in the transmission operation mode.

* * * * *